United States Patent
Cheng et al.

(10) Patent No.: US 12,464,860 B2
(45) Date of Patent: Nov. 4, 2025

(54) FULL-COLOR LED STRUCTURE, AND FULL-COLOR LED STRUCTURE UNIT AND METHOD FOR MANUFACTURING SAME

(71) Applicant: ENKRIS SEMICONDUCTOR, INC., Jiangsu (CN)

(72) Inventors: Kai Cheng, Jiangsu (CN); Liyang Zhang, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 443 days.

(21) Appl. No.: 18/031,316

(22) PCT Filed: Nov. 20, 2020

(86) PCT No.: PCT/CN2020/130371
§ 371 (c)(1),
(2) Date: Apr. 11, 2023

(87) PCT Pub. No.: WO2022/104680
PCT Pub. Date: May 27, 2022

(65) Prior Publication Data
US 2023/0378396 A1   Nov. 23, 2023

(51) Int. Cl.
*H10H 20/821* (2025.01)
*H10H 20/01* (2025.01)
(Continued)

(52) U.S. Cl.
CPC .... *H10H 20/821* (2025.01); *H10H 20/01335* (2025.01); *H10H 20/812* (2025.01); *H10H 20/825* (2025.01)

(58) Field of Classification Search
None
See application file for complete search history.

(56) References Cited

U.S. PATENT DOCUMENTS

| 7,348,600 | B2 * | 3/2008 | Narukawa | H01S 5/34333 257/E31.058 |
| 8,216,951 | B2 * | 7/2012 | Cheng | H10D 62/40 438/797 |
| 2005/0082544 | A1 | 4/2005 | Narukawa et al. | |

FOREIGN PATENT DOCUMENTS

CN    204696145 U    10/2015
CN    106653964 A    5/2017
(Continued)

OTHER PUBLICATIONS

ISA State Intellectual Property Office of the People's Republic of China, International Search Report Issued in Application No. PCT/CN2020/130371, Aug. 18, 2021, WIPO, 4 pages.
(Continued)

*Primary Examiner* — Bradley Smith
(74) *Attorney, Agent, or Firm* — Christopher R. Carroll; The Small Patent Law Group LLC

(57) ABSTRACT

The present disclosure provides a full-color LED structure, a full-color LED structure unit, and a method for manufacturing the same. Different wavelengths of light emitted from the first sub-region, the second sub-region and the third sub-region of the light-emitting layer are achieved by controlling different surface dimensions of the bottom wall and the side wall of the first trench or the top wall of the first semiconductor layer. The above process is simple and can form full-color LED structure units during a single epitaxial growth process of the light-emitting layer, such that the size of the full-color LED is reduced, the cost is reduced, the service life is extended, and the reliability is improved.

19 Claims, 8 Drawing Sheets

(51) Int. Cl.
*H10H 20/812* (2025.01)
*H10H 20/825* (2025.01)

(56) References Cited

FOREIGN PATENT DOCUMENTS

| | | |
|---|---|---|
| CN | 110212068 A | 9/2019 |
| CN | 110880522 A | 3/2020 |
| CN | 110931619 A | 3/2020 |
| JP | 106310762 A | 11/1994 |
| KR | 20100136684 A | 12/2010 |
| KR | 20130005961 A | 1/2013 |
| KR | 20130091022 A | 8/2013 |

OTHER PUBLICATIONS

ISA State Intellectual Property Office of the People's Republic of China, Written Opinion of the International Searching Authority Issued in Application No. PCT/CN2020/130371, Aug. 18, 2021, WIPO, 5 pages.(Submitted with Machine/Partial Translation).
TW Patent Office, Office Action Issued in Application No. 110141630, Aug. 17, 2022, 20 pages.(Submitted with Machine/Partial Translation).

\* cited by examiner

FULL-COLOR LED STRUCTURE, AND FULL-COLOR LED STRUCTURE UNIT AND METHOD FOR MANUFACTURING SAME

CROSS REFERENCE TO RELATED APPLICATIONS

The present application is the U.S. national phase of PCT Application No. PCT/CN2020/130371 filed on Nov. 20, 2020, which is incorporated herein by reference in its entirety.

TECHNICAL FIELD

The present application relates to the field of semiconductor technologies, and in particular to a full-color LED structure, a full-color LED structure unit, and a method for manufacturing the same.

BACKGROUND

A light-emitting diode, referred to as an LED, emits visible light by using the compound radiation between electrons and holes. The two main applications of the LED include lighting and display. Especially in the display field, the future development trend is longer life, higher image quality, and higher definition (more pixels and smaller size pixels). The key technology to achieve high-definition display is to achieve ultra-small light-emitting pixels, which requires a smaller size full-color LED light-emitting unit.

In the related art, on the one hand, the current size of a full-color LED packaging unit is 1 mm*1 mm. The red, green and blue normal LED chips are packaged onto a printed circuit board (PCB) through a die bond and wire bond process. The electrodes of the three chips are lead out from the back of the PCB by using a conductive through-hole process to form a full-color LED packaging unit. Through the chip on board (COB) packaging process, the full-color LED packaging unit is pressed and welded to the board, and a dot matrix LED display screen is formed through row and column wiring on the board. The full-color LED packaging units and dot matrix LED displays are both large in size and high in cost.

On the other hand, the light-emitting layer in the LED is achieved by wavelength conversion using phosphors or quantum dots, for example, the light-emitting layer in LED is achieved by applying red phosphor and green phosphor on the blue LED, or by applying blue phosphor, green phosphor and red phosphor on the ultraviolet LED. The disadvantages of this method are the short lifetime and reliability problems of the phosphors or the quantum dots. Therefore, there is an urgent need for an LED structure that can solve the problem of complex driving circuits for the multi-color LED and the blue light hazard of the ultraviolet LED with the blue-green-red phosphors, and at the same time, the color rendering of which is good and the luminous wavelength of which can be freely adjusted.

SUMMARY

The present disclosure aims to provide a full-color LED structure, a full-color LED structure unit and a method for manufacturing the same, with small size, low cost, long life and high reliability.

To achieve the above purpose, a first aspect of the present disclosure provides a full-color LED structure unit including:

a first semiconductor layer, in which a first trench is provided;

a light-emitting layer including a first sub-region, a second sub-region and a third sub-region, where the first sub-region covers a bottom wall of the first trench, the second sub-region covers side walls of the first trench, and the third sub-region covers a top wall of the first semiconductor layer; and a second semiconductor layer covering the light-emitting layer, where the second semiconductor layer has an opposite conductive type to the first semiconductor layer, and materials of the first semiconductor layer, the light-emitting layer, and the second semiconductor layer are a group III-V compound;

where different wavelengths of light emitted from the first sub-region, the second sub-region and the third sub-region are achieved by controlling different surface dimensions of the bottom wall and the side wall of the first trench or the top wall of the first semiconductor layer.

Optionally, in any one vertical section of the full-color LED structure unit, a width of the bottom wall is smaller than a width of the top wall, and a wavelength of light emitted from the third sub-region is greater than a wavelength of light emitted from any one of the first sub-region and the second sub-region.

Optionally, the side walls include a first side wall which is perpendicular to a first vertical section of the full-color LED structure unit; in the first vertical section, the bottom wall has a width greater than a height of the side wall, and a wavelength of light emitted from the first sub-region is greater than a wavelength of light emitted from the second sub-region on the first side wall; or the bottom wall has a width smaller than a height of the side wall, and a wavelength of light emitted from the first sub-region is smaller than a wavelength of light emitted from the second sub-region on the first side wall; and/or the side walls include a second side wall which is perpendicular to a second vertical section of the full-color LED structure unit; in the second vertical section, the bottom wall has a length greater than a height of the side wall, and a wavelength of light emitted from the first sub-region is greater than a wavelength of light emitted from the second sub-region on the second side wall; or the bottom wall has a length smaller than a height of the side wall, and a wavelength of light emitted from the first sub-region is smaller than a wavelength of light emitted from the second sub-region on the second side wall.

Optionally, the first semiconductor layer is disposed on a substrate, the substrate has a flat surface, or the substrate is provided with a second trench, and the first trench is disposed correspondingly at the second trench.

Optionally, he light-emitting layer includes a single quantum well layer or a multiple quantum well layer, the single quantum well layer or the multiple quantum well layer includes an indium element.

A second aspect of the present disclosure provides a full-color LED structure including a plurality of full-color LED structure units according to the first aspect of the present disclosure.

Optionally, at least one of the plurality of full-color LED structure units has a different surface dimension of the bottom wall from the other full-color LED structure units, and/or at least one of the plurality of the full-color LED structure units has a different surface dimension of the side wall from the other full-color LED structure units, and/or at least one of the plurality of the full-color LED structure units has a different surface dimension of the top wall from the other full-color LED structure units.

Optionally, the plurality of full-color LED structure units are divided into a plurality of groups, and in each of the plurality of groups, at least one full-color LED structure unit has a different surface dimension of the bottom wall, the side wall or the top wall from the other full-color LED structure units of the group.

Optionally, the plurality of full-color LED structure units are divided into a plurality of groups, for each of the plurality of groups, the full-color LED structure units of the group are the same; the full-color LED structure units of at least one of the plurality of groups have a different surface dimension of the bottom wall, the side wall or the top wall from the full-color LED structure units of the other groups of the plurality of groups.

Optionally, the first semiconductor layers of the plurality of full-color LED structure units are connected together, or the second semiconductor layers of the plurality of full-color LED structure units are connected together.

A third aspect of the present disclosure provides a method for manufacturing a full-color LED structure unit including:
  providing a first semiconductor layer, in which a first trench is formed;
  forming a light-emitting layer including a first sub-region, a second sub-region and a third sub-region, where the first sub-region covers a bottom wall of the first trench, the second sub-region covers side walls of the first trench, and the third sub-region covers a top wall of the first semiconductor layer; and
  forming a second semiconductor layer covering the light-emitting layer, where the second semiconductor layer has an opposite conductive type to the first semiconductor layer, and materials of the first semiconductor layer, the light-emitting layer, and the second semiconductor layer are a group III-V compound;
  where different wavelengths of light emitted from the first sub-region, the second sub-region and the third sub-region are achieved by controlling different surface dimensions of the bottom wall and the side wall of the first trench or the top wall of the first semiconductor layer.

Optionally, any one vertical section of the full-color LED structure unit, a width of the bottom wall is controlled to be smaller than a width of the top wall, such that a wavelength of light emitted from the third sub-region is greater than a wavelength of light emitted from any one of the first sub-region and the second sub-region.

Optionally, the side walls include a first side wall which is perpendicular to a first vertical section of the full-color LED structure unit; in the first vertical section, a width of the bottom wall is controlled to be greater than a height of the side wall, such that a wavelength of light emitted from the first sub-region is greater than a wavelength of light emitted from the second sub-region on the first side wall; or a width of the bottom wall is controlled to be smaller than a height of the side wall, such that a wavelength of light emitted from the first sub-region is smaller than a wavelength of light emitted from the second sub-region on the first side wall; and/or
  the side walls include a second side wall which is perpendicular to a second vertical section of the full-color LED structure unit; in the second vertical section, a length of the bottom wall is controlled to be greater than a height of the side wall, such that a wavelength of light emitted from the first sub-region is greater than a wavelength of light emitted from the second sub-region on the second side wall; or a length of the bottom wall is controlled to be smaller than a height of the side wall, such that a wavelength of light emitted from the first sub-region is smaller than a wavelength of light emitted from the second sub-region on the second side wall.

Optionally, the first semiconductor layer is formed on a substrate, the substrate has a flat surface, or a second trench is formed in the substrate, and the first trench is formed correspondingly at the second trench.

Optionally, the light-emitting layer includes a single quantum well layer or a multiple quantum well layer, the single quantum well layer or the multiple quantum well layer includes an indium element.

Figure 1:
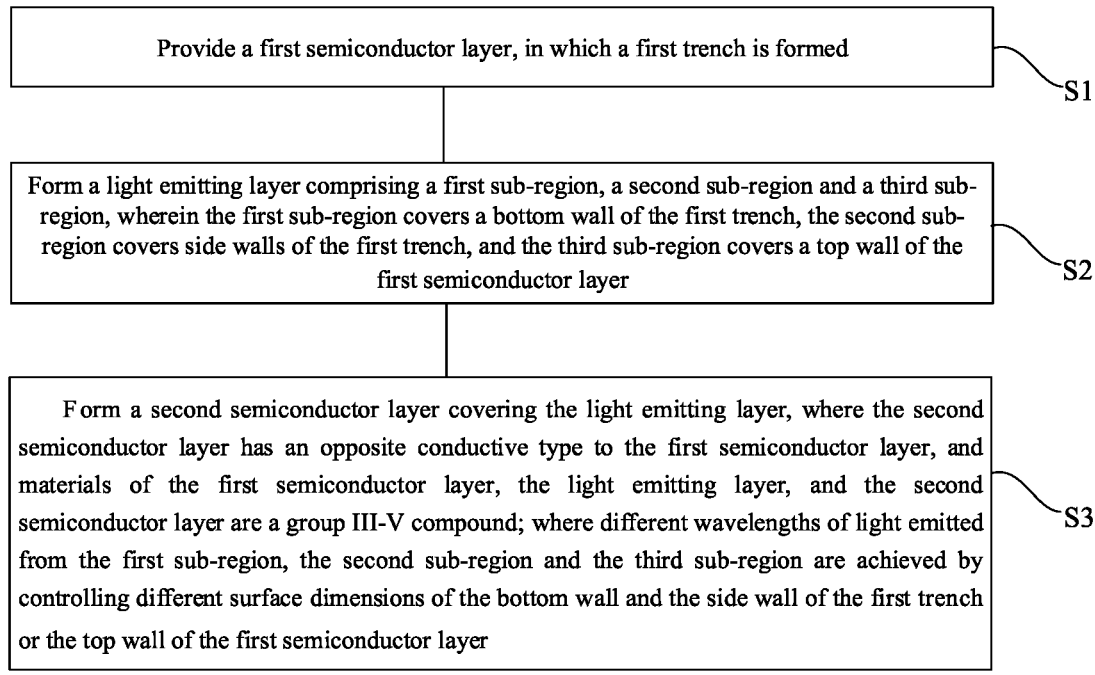
FIG. 1 is a flowchart illustrating a method for manufacturing a full-color LED structure unit according to a first embodiment of the present disclosure.

For the convenience of understanding of the present disclosure, all reference numerals appearing in the present disclosure are listed below:
  First semiconductor layer 11;
  First trench 110;
  Bottom wall 110$a$;
  Side wall 110$b$;
  First side wall 110$c$;
  Second side wall 110$d$;
  Top wall 11$c$;
  Width X2 of the top wall 11$c$;
  Width X21 of the top wall located at one side of the first trench;
  Length Y1 of the bottom wall;
  Width X22 of the top wall located at the other side of the first trench;
  Length Y2 of the top wall;

Length Y21 of the top wall located at one side of the first trench;
Height Z of the side wall;
Length Y22 of the top wall located at the other side of the first trench;
Width X1 of the bottom wall;
Light-emitting layer 12;
First sub-region 12a;
Second sub-region 12b;
Third sub-region 12c;
Second semiconductor layer 13;
Second trench 101;
Full-color LED structure unit 1, 2, 3 or 4.

DETAILED DESCRIPTION OF THE EMBODIMENTS

To make the forgoing objectives, features and advantages of the present disclosure clearer and more comprehensible, the following describes the specific embodiments of the present disclosure in detail with reference to the accompanying drawings.

Figure 2:
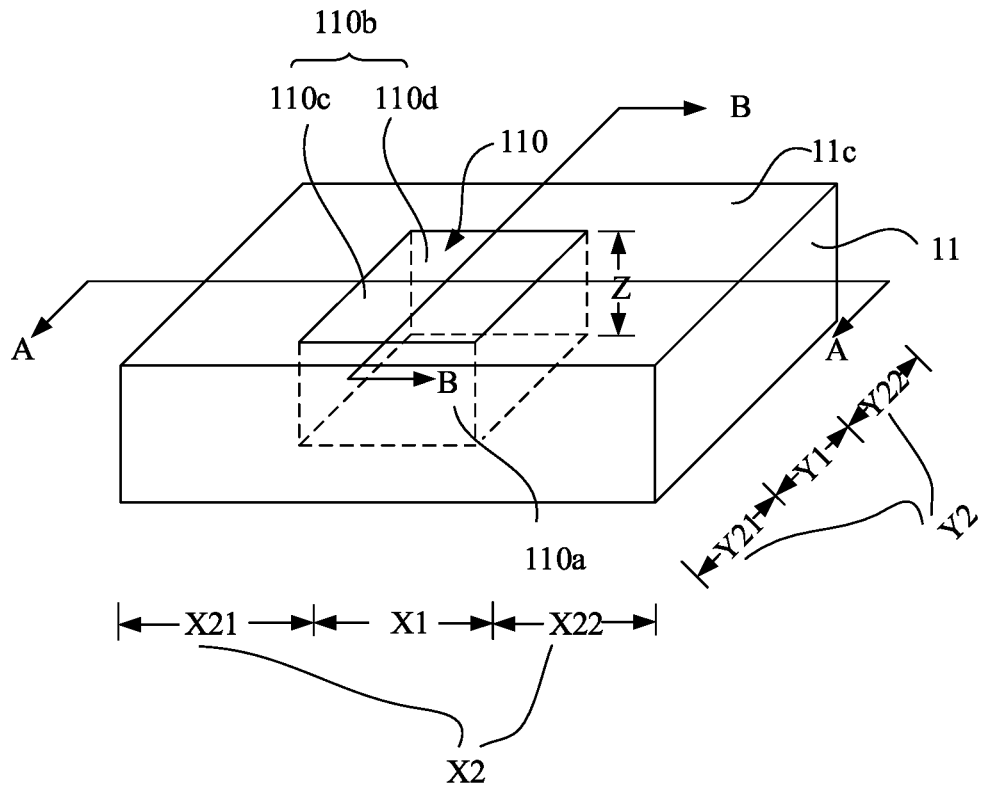
FIG. 2 is a schematic diagram illustrating an intermediate structure corresponding to the process in FIG. 1.
Figure 3:
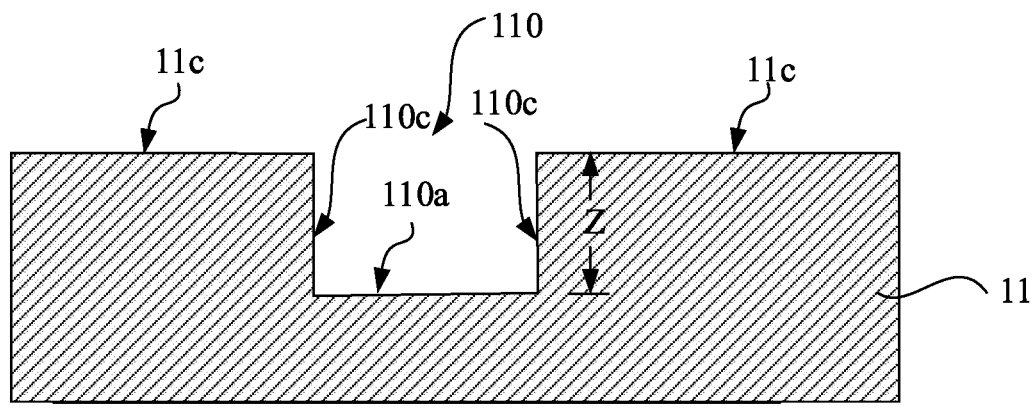
FIG. 3 is a sectional view along line AA in FIG. 2.
Figure 3:
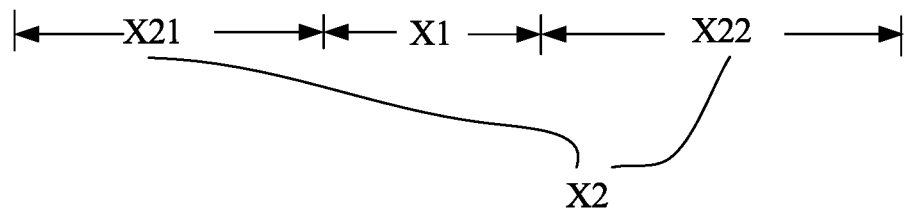
Figure 4:
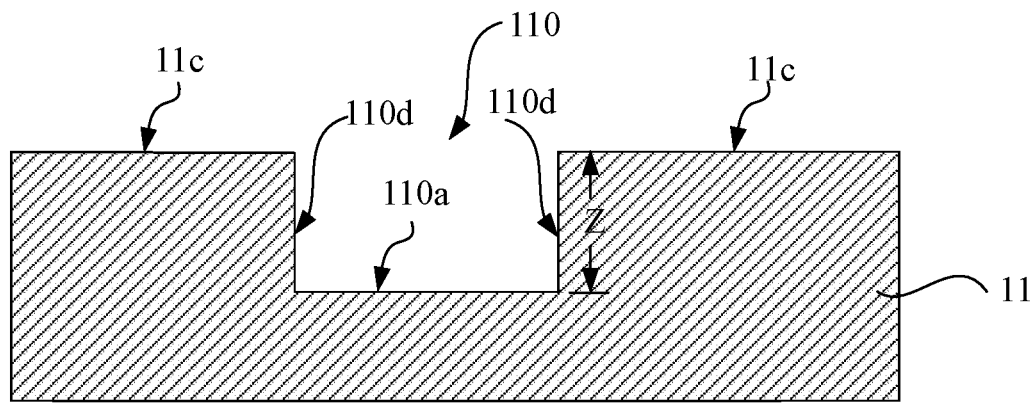
FIG. 4 is a sectional view along line BB in FIG. 2.
Figure 4:
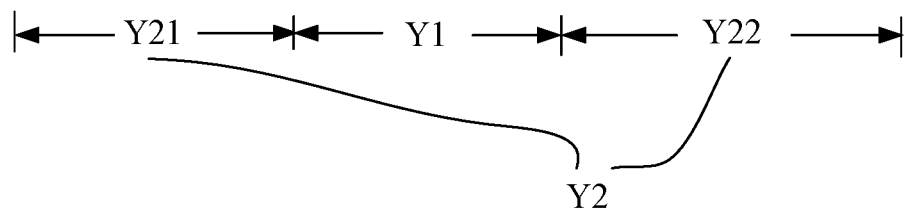
Figure 5:
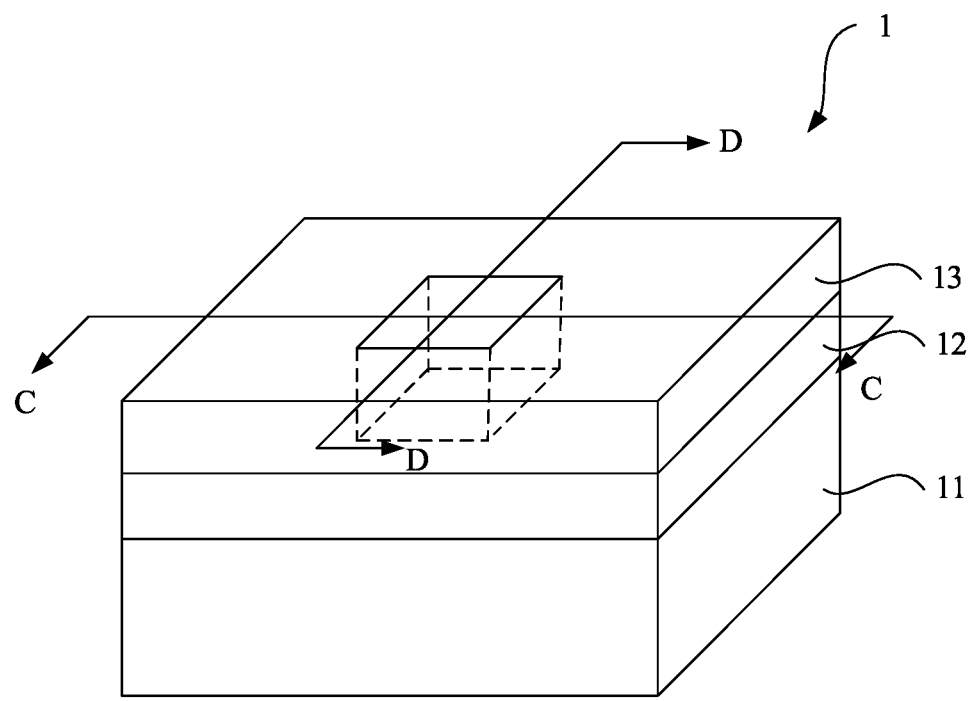
FIG. 5 is a schematic structural diagram illustrating the full-color LED structure unit according to the first embodiment of the present disclosure.
Figure 6:
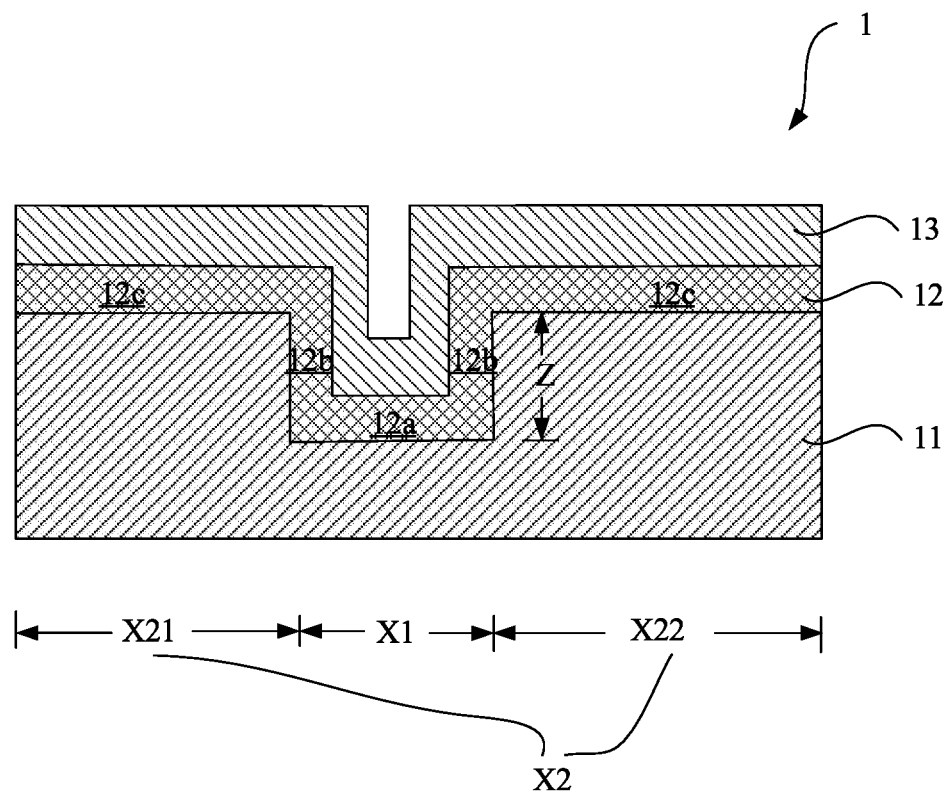
FIG. 6 is a sectional view along line CC in FIG. 5.
Figure 7:
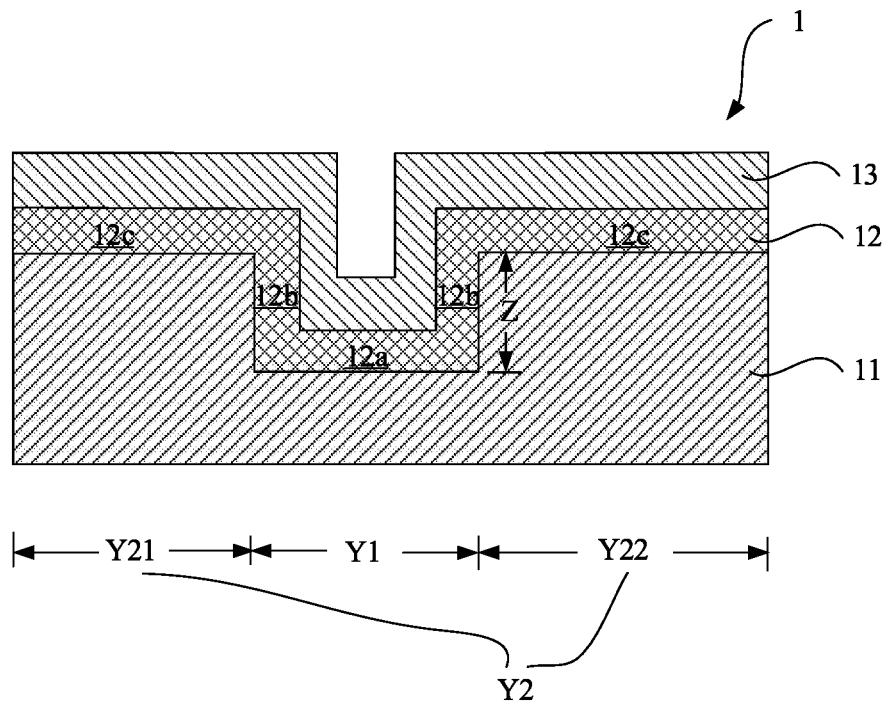
FIG. 7 is a sectional view along line DD in FIG. 5.

FIG. 1 is a flowchart illustrating a method for manufacturing a full-color LED structure unit according to a first embodiment of the present disclosure; FIG. 2 is a schematic diagram illustrating an intermediate structure corresponding to the process in FIG. 1; FIG. 3 is a sectional view along line AA in FIG. 2; FIG. 4 is a sectional view along line BB in FIG. 2; FIG. 5 is a schematic structural diagram illustrating the full-color LED structure unit according to the first embodiment of the present disclosure; FIG. 6 is a sectional view along line CC in FIG. 5; and FIG. 7 is a sectional view along line DD in FIG. 5.

Referring to step S1 in FIG. 1, FIG. 2, FIG. 3, and FIG. 4, a first semiconductor layer 11 is provided, and a first trench 110 is formed in the first semiconductor layer 11.

A material of the first semiconductor layer 11 is a group III-V compound, and may specifically include at least one of GaN or AlGaN.

It is to be noted that in the embodiment, a material is represented by a chemical element without limiting the molar percentage of each chemical element in the material. For example, in the GaN material, Ga element and N element are included, but the molar percentage of Ga element and N element is not limited. In the AlGaN material, Al, Ga and N elements are included, but the molar percentage of each element is not limited.

A conductive type of the first semiconductor layer 11 may be P-type, and the P-type doping ion may be at least one of a Mg ion, a Zn ion, a Ca ion, a Sr ion, or a Ba ion.

In the embodiment, with reference to FIG. 2, a cross section of the first trench 110 has a rectangular shape, a width of X1, and a length of Y1. The cross section refers to a section parallel to a top wall 11c of the first semiconductor layer 11, that is, parallel to a surface to be grown.

In other embodiments, the shape of the cross section of the first trench 110 may also be one of a circle, a triangle, a hexagon, and a trapezoid.

The first trench 110 includes a bottom wall 110a and side walls 110b. The side walls 110b include a first side wall 110c and a second side wall 110d, the first side wall 110c is perpendicular to a first vertical section (section along line AA) of the full-color LED structure unit 1, and the second side wall 110d is perpendicular to a second vertical section (section along line BB) of the full-color LED structure unit 1.

The first trench 110 can be achieved by dry etching or by wet etching.

The dry etching may be inductively coupled plasma etching (ICP). The etching gas may include $Cl_2$ and $BCl_3$.

The etching solution for wet etching may be $H_3PO_4$ solution or KOH solution, which is corrosive on the N surface. The GaN crystal has a wurtzite structure, where the layers of Ga and N atoms are stacked in ABABAB hexagonal layers, and each Ga (N) atom is bonded to the surrounding four N (Ga) atoms in a diamond-like tetrahedral structure. Using a Ga—N bond parallel to a C axis ([0001] crystal orientation) as a reference, if the Ga atom in each Ga—N bond is farther away from the lower surface, the upper surface is a Ga surface; if the N atom in each Ga—N bond is farther away from the lower surface, the upper surface is an N surface. In this embodiment, the upper surface of the first semiconductor layer 11 may be controlled to be an N surface.

Referring to step S2 in FIG. 1, FIG. 5, FIG. 6, and FIG. 7, the light-emitting layer 12 is formed, and the light-emitting layer 12 includes a first sub-region 12a, a second sub-region 12b, and a third sub-region 12c. The first sub-region 12a covers the bottom wall 110a of the first trench 110, the second sub-region 12b covers the side walls 110b of the first trench 110, and the third sub-region 12c covers the top wall 11c of the first semiconductor layer 11.

The light-emitting layer 12 may include at least one of a single quantum well structure, a multiple quantum well (MQW) structure, a quantum line structure, or a quantum dot structure. The light-emitting layer 12 may include a well layer and a potential barrier layer. A forbidden band width of the well layer is smaller than a forbidden band width of the potential barrier layer.

A material of the light-emitting layer 12 is a group III-V compound, specifically a GaN-based material, which may be doped with an indium (In) element, specifically InGaN, for example, and in other embodiments, may be doped with other light-emitting wavelength-sensitive elements.

The growth process of the light-emitting layer 12 may include: atomic layer deposition (ALD), or chemical vapor deposition (CVD), or molecular beam epitaxy (MBE), or plasma enhanced chemical vapor deposition (PECVD), or low pressure chemical vapor deposition (LPCVD), or metal organic compound chemical vapor deposition (MOCVD), or any combination thereof.

When growing the light-emitting layer 12, the surface dimensions of the bottom wall 110a and the side wall 110b of the first trench 110 and the top wall 11c of the first semiconductor layer 11 are different, so that the doping rates of the In element and the Ga element in the GaN-based material grown on the corresponding surfaces are different, i.e., the doping efficiency of the In element is different, such that the percentage of the In element in the grown light-emitting layer 12 is different.

Specifically, in this embodiment, with reference to FIG. 3 and FIG. 6, in the first vertical section (section along line AA/line CC), a width X1 of the bottom wall 110a is smaller than a width X2 of the top wall 11c, and the width X2 of the top wall 11c is obtained by adding a width X21 of the top wall located at one side of the first trench 110 and a width X22 of the top wall located at the other side of the first trench 110. With reference to FIG. 4 and FIG. 7, in the second vertical section (section along line BB/line DD), a length Y1 of the bottom wall 110a is smaller than a length Y2 of the top wall 11c, and a length Y2 of the top wall 11c is obtained by adding a length Y21 of the top wall located at one side of the first trench 110 and a length Y22 of the top wall located at the other side of the first trench 110, i.e., the area of the top wall 11c is larger than the area of the bottom wall 110a. Since the area of the top wall 11c is larger than the area of the bottom wall 110a, the growth rate of the base material GaN in the third sub-region 12c corresponding to the top wall 11c will be faster than the growth rate of the base material GaN in the first sub-region 12a corresponding to the bottom wall 110a, the doping of the In element has better selectivity, and the doping rate of the In element is larger than the doping rate of the Ga element, therefore, in the case that the material of the third sub-region 12c and the material of the first sub-region 12a are both InGaN, the percentage of the In element in the third sub-region 12c is higher than that in the first sub-region 12a.

In addition, when the area of the top wall 11c is larger than the area of the bottom wall 110a, the growth rate of the base material GaN in the third sub-region 12c corresponding to the top wall 11c will also be faster than the growth rate of the base material GaN in the second sub-region 12b corresponding to the side wall 110b, so that the percentage of the In element in the third sub-region 12c is higher than that in the second sub-region 12b in the case that the material of the third sub-region 12c and the material of the second sub-region 12b are both InGaN.

In other embodiments, when the shape of the cross section of the first trench 110 is other shapes, that the width X1 of the bottom wall 110a is smaller than the width X2 of the top wall 11c in any vertical section of the full-color LED structure unit 1 can be controlled, so that the percentage of the In element in the third sub-region 12c is higher than that in any one of the first sub-region 12a and the second sub-region 12b in the case that the material of the third sub-region 12c, the material of the second sub-region 12b and the material of the first sub-region 12a are all InGaN.

In this embodiment, with continued reference to FIG. 3 and FIG. 6, in the first vertical section (section along line AA/line CC), the width X1 of the bottom wall 110a is greater than the height Z of the side wall 110b, the area of the bottom wall 110a is greater than the area of the first side wall 110c, and the percentage of the In element in the first sub-region 12a is higher than that in the second sub-region 12b on the first side wall 110c in the case that the material of the first sub-region 12a and the material of the second sub-region 12b on the first side wall 110c are both InGaN.

With continued reference to FIG. 4 and FIG. 7, in the second vertical section (section along line BB/line DD), the length Y1 of the bottom wall 110a is greater than the height Z of the side wall 110b, the area of the bottom wall 110a is greater than the area of the second side wall 110d, and the percentage of the In element in the first sub-region 12a is higher than that in the second sub-region 12b on the second side wall 110d in the case that the material of the first sub-region 12a and the material of the second sub-region 12b on the second side wall 110d are both InGaN.

With reference to step S3 in FIG. 1, FIG. 5, FIG. 6, and FIG. 7, a second semiconductor layer 13 is formed to cover the light-emitting layer 12, the second semiconductor layer 13 has an opposite conductive type to the first semiconductor layer 11.

By controlling different surface dimensions of the bottom wall 110a and the side wall 110b of the first trench 110 or the top wall 11c of the first semiconductor layer 11, wavelengths of light emitted from the first sub-region 12a, the second sub-region 12b and the third sub-region 12c are different.

A forbidden band width of InN is about 0.7 eV, and is smaller than a forbidden band width of GaN of 3.4 eV, and thus the greater the doping amount of In, the longer the wavelength of light emitted from the light-emitting layer 12.

The material of the second semiconductor layer 13 is a group III-V compound, and may specifically include at least one of GaN or AlGaN.

In this embodiment, the conductive type of the second semiconductor layer 13 may be N-type, and the N-type doping ion may be at least one of a Si ion, a Ge ion, a Sn ion, a Se ion, or a Te ion.

The growth process of the group III-V compound of N-type may be referred to the growth process of the light-emitting layer 12 described previously. The N-type doping ions may be achieved by an in-situ doping process.

In other embodiments, the conductive type of the first semiconductor layer 11 may be N-type, and the conductive type of the second semiconductor layer 13 is P-type.

In this embodiment, with reference to FIG. 3 and FIG. 6, in the first vertical section (section along line AA/line CC), the width X1 of the bottom wall 110a is smaller than the width X2 of the top wall 11c, and with reference to FIG. 4 and FIG. 7, in the second vertical section (section along line BB/line DD), the length Y1 of the bottom wall 110a is smaller than the length Y2 of the top wall 11c, i.e., the area of the top wall 11c is larger than the area of the bottom wall 110a. In this way, the percentage of the In element in the third sub-region 12c is higher than that in the first sub-region 12a in the case that the material of the third sub-region 12c and the material of the first sub-region 12a are both InGaN, and the wavelength of the light emitted from the third sub-region 12c is larger than the wavelength of the light emitted from the first sub-region 12a. In addition, the thickness of the third sub-region 12c is greater than that of the first sub-region 12a, and the wavelength of the light emitted from the third sub-region 12c will increase accordingly because of the quantum Stark effect.

When the area of the top wall 11c is larger than the area of the bottom wall 110a, the percentage of the In element in the third sub-region 12c is higher than that in the second sub-region 12b in the case that the material of the third sub-region 12c and the material of the second sub-region 12b are both InGaN, and thus the wavelength of the light emitted from the third sub-region 12c is larger than the wavelength of the light emitted from the second sub-region 12b.

In other embodiments, when the shape of the cross section of the first trench 110 is other shapes, that the width X1 of the bottom wall 110a is smaller than the width X2 of the top wall 11c in any vertical section of the full-color LED structure unit 1 can be controlled, so that the wavelength of the light emitted from the third sub-region 12c is greater than the wavelength of the light emitted from any one of the first sub-region 12a and the second sub-region 12b.

In this embodiment, with continued reference to FIG. 3 and FIG. 6, in the first vertical section (section along line AA/line CC), the width X1 of the bottom wall 110a is greater than the height Z of the side wall 110b, the area of the bottom wall 110a is greater than the area of the first side wall 110c. In this way, the percentage of the In element in the first sub-region 12a is higher than that in the second sub-region 12b on the first side wall 110c in the case that the material of the first sub-region 12a and the material of the second sub-region 12b on the first side wall 110c are both InGaN, and thus the wavelength of the light emitted from the first sub-region 12a is greater than the wavelength of the light emitted from the second sub-region 12b on the first side wall 110c.

With continued reference to FIG. 4 and FIG. 7, in the second vertical section (section along line BB/line DD), the length Y1 of the bottom wall 110*a* is greater than the height Z of the side wall 110*b*, the area of the bottom wall 110*a* is greater than the area of the second side wall 110*d*. In this way, the percentage of the In element in the first sub-region 12*a* is higher than that in the second sub-region 12*b* on the second side wall 110*d* in the case that the material of the third sub-region 12*a* and the material of the second sub-region 12*b* on the second side wall 110*d* are both InGaN, and thus the wavelength of the light emitted from the first sub-region 12*a* is greater than the wavelength of the light emitted from the second sub-region 12*b* on the second side wall 110*d*.

For example, the surface dimensions of the bottom wall 110*a* and the side wall 110*b* of the first trench 110, or the top wall 11*c* of the first semiconductor layer 11 can be controlled to be different, so that the wavelength of the light emitted from the third sub-region 12*c* is a wavelength of a first base color, such as red, the wavelength of the light emitted from the first sub-region 12*a* is a wavelength of a second base color, such as green, and the wavelength of the light emitted from the second sub-region 12*b* is a wavelength of a third base color, such as blue, thereby the full-color LED structure unit 1 is formed. The above process is simple and can form a full-color LED structure unit 1 in a single epitaxial growth process of the light-emitting layer 12, such that the size of the full-color LED is reduced, the cost is reduced, the service life is extended, and the reliability is improved.

Referring to FIGS. 5 to 7, the full-color LED structure unit 1 in the first embodiment includes:

a first semiconductor layer 11, in which a first trench 110 is provided;
a light-emitting layer 12 including a first sub-region 12*a*, a second sub-region 12*b* and a third sub-region 12*c*, where the first sub-region 12*a* covers a bottom wall 110*a* of the first trench 110, the second sub-region 12*b* covers side walls 110*b* of the first trench 110, and the third sub-region 12*c* covers a top wall 11*c* of the first semiconductor layer 11; and
a second semiconductor layer 13 covering the light-emitting layer 12, where the second semiconductor layer 13 has an opposite conductive type to the first semiconductor layer 11, and materials of the first semiconductor layer 11, the light-emitting layer 12, and the second semiconductor layer 13 are a group III-V compound;
where different wavelengths of light emitted from the first sub-region 12*a*, the second sub-region 12*b* and the third sub-region 12*c* are achieved by controlling different surface dimensions of the bottom wall 110*a* and the side wall 110*b* of the first trench 110 or the top wall 11*c* of the first semiconductor layer 11.

The surface dimensions include an area or a one-dimensional dimension in a certain direction.

Figure 8:
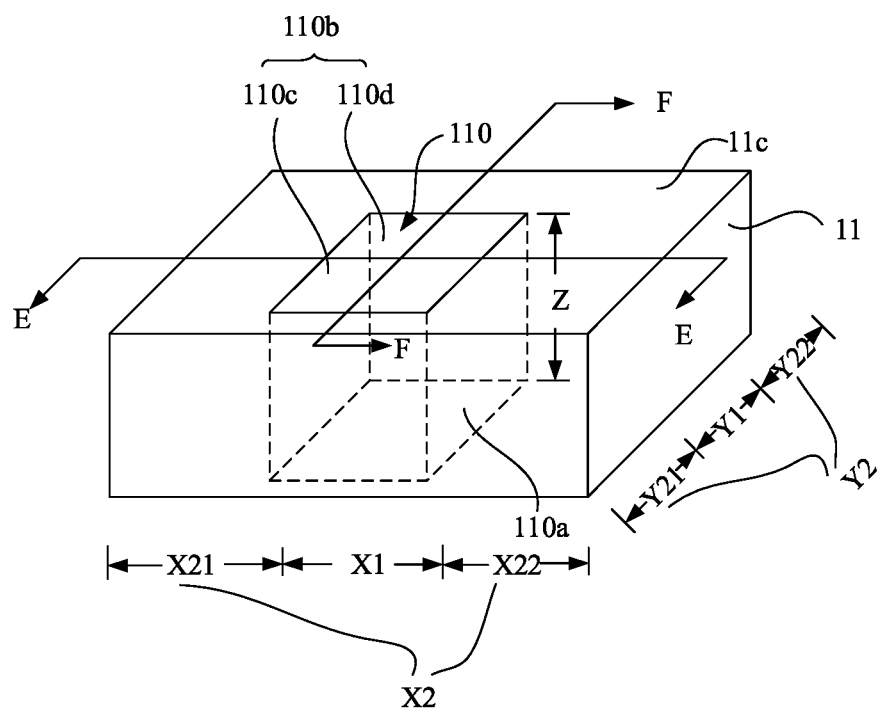
FIG. 8 is a schematic diagram illustrating an intermediate structure corresponding to a method for manufacturing a full-color LED structure unit according to a second embodiment of the present disclosure.
Figure 9:
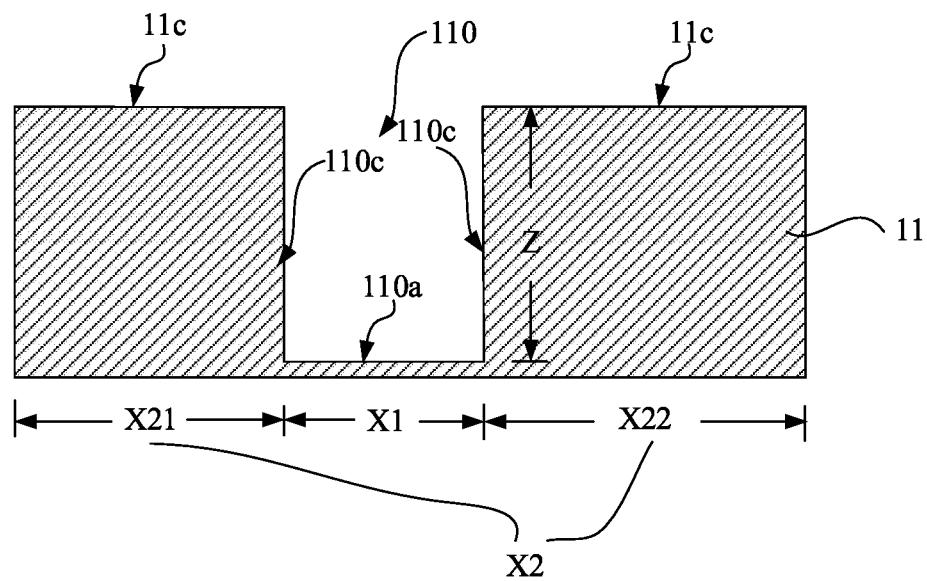
FIG. 9 is a sectional view along line EE in FIG. 8.
Figure 10:
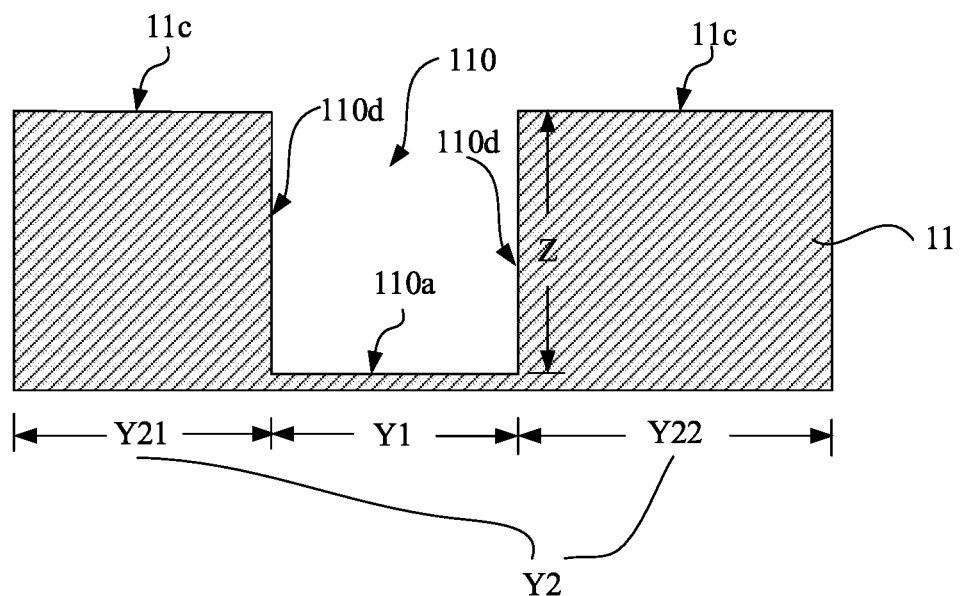
FIG. 10 is a sectional view along line FF in FIG. 8.
Figure 11:
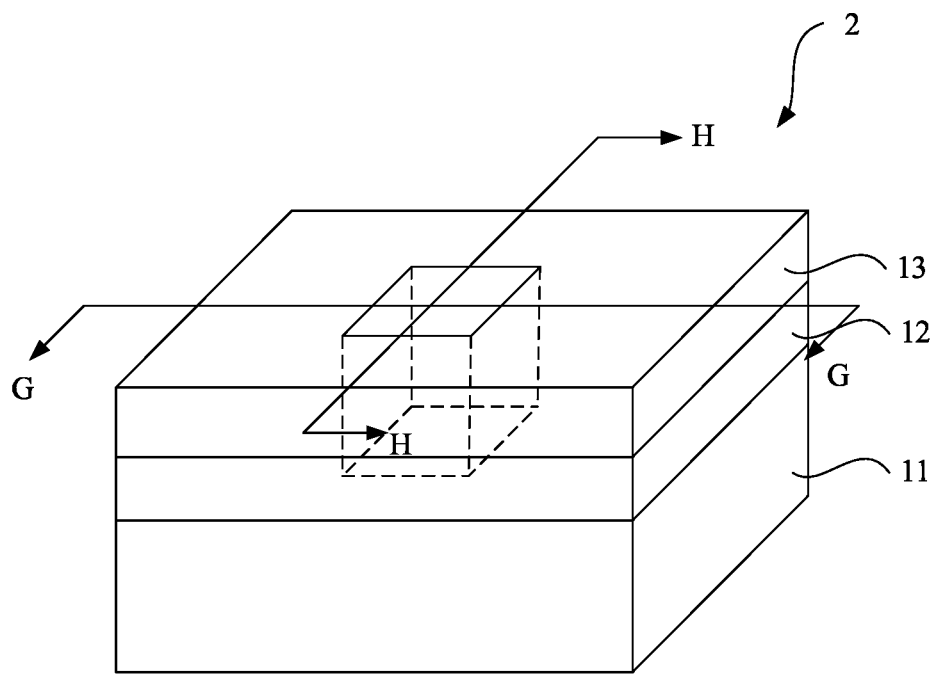
FIG. 11 is a schematic structural diagram illustrating the full-color LED structure unit according to the second embodiment of the present disclosure.
Figure 12:
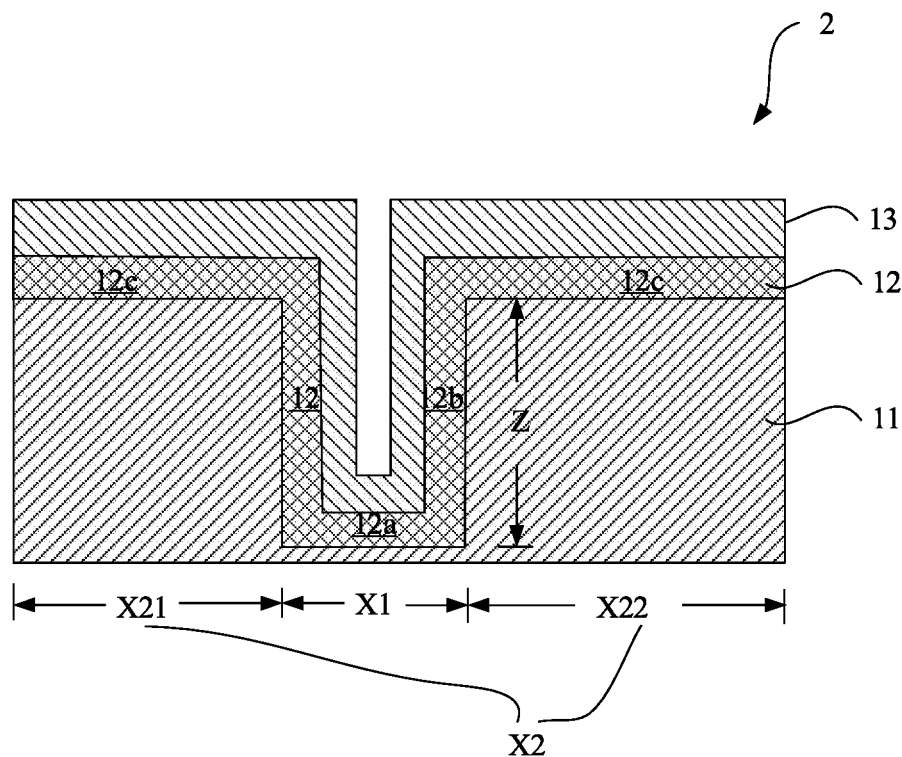
FIG. 12 is a sectional view along line GG in FIG. 11.
Figure 13:
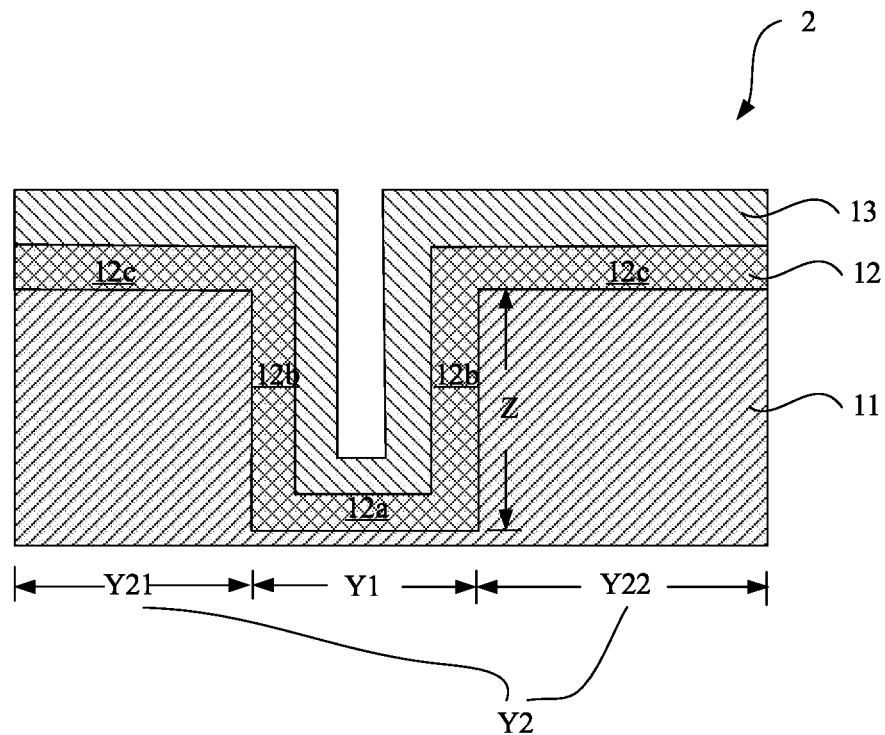
FIG. 13 is a sectional view along line HH in FIG. 11.

FIG. 8 is a schematic diagram illustrating an intermediate structure corresponding to a method for manufacturing a full-color LED structure unit according to a second embodiment of the present disclosure. FIG. 9 is a sectional view along line EE in FIG. 8. FIG. 10 is a sectional view along line FF in FIG. 8. FIG. 11 is a schematic structural diagram illustrating the full-color LED structure unit according to the second embodiment of the present disclosure. FIG. 12 is a sectional view along line GG in FIG. 11. FIG. 13 is a sectional view along line HH in FIG. 11.

Referring to FIGS. 8 to 13, a full-color LED structure unit 2 of and a method for manufacturing the same in the second embodiment are substantially the same as the full-color LED structure unit 1 of and a method for manufacturing the same in the first embodiment, differing only in that:

1) referring to FIG. 8, FIG. 9, FIG. 11, and FIG. 12, in step S1, in the first vertical section (section along line EE/line GG), the width X1 of the bottom wall 110*a* is smaller than the height Z of the side wall 110*b*, and the area of the bottom wall 110*a* is smaller than the area of the first side wall 110*c*; correspondingly, in step S2, in the case that the material of the first sub-region 12*a* and the material of the second sub-region 12*b* on the first side wall 110*c* are both InGaN, the percentage of the In element in the first sub-region 12*a* is lower than that in the second sub-region 12*b* on the first side wall 110*c*; in step S3, the wavelength of the light emitted from the first sub-region 12*a* is smaller than the wavelength of the light emitted from the second sub-region 12*b* on the first sidewall 110*c*.

2) Referring to FIG. 8, FIG. 10, FIG. 11, and FIG. 13, in step S1, in the second vertical section (section along line FF/line HH), the length Y1 of the bottom wall 110*a* is smaller than the height Z of the side wall 110*b*, and the area of the bottom wall 110*a* is smaller than the area of the second side wall 110*d*; correspondingly, in step S2, in the case that the material of the first sub-region 12*a* and the material of the second sub-region 12*b* on the second side wall 110*d* are both InGaN, the percentage of the In element in the first sub-region 12*a* is higher than that in the second sub-region 12*b* on the second side wall 110*d*; in step S3, the wavelength of the light emitted from the first sub-region 12*a* is smaller than the wavelength of the light emitted from the second sub-region 12*b* on the second sidewall 110*d*.

Figure 14:
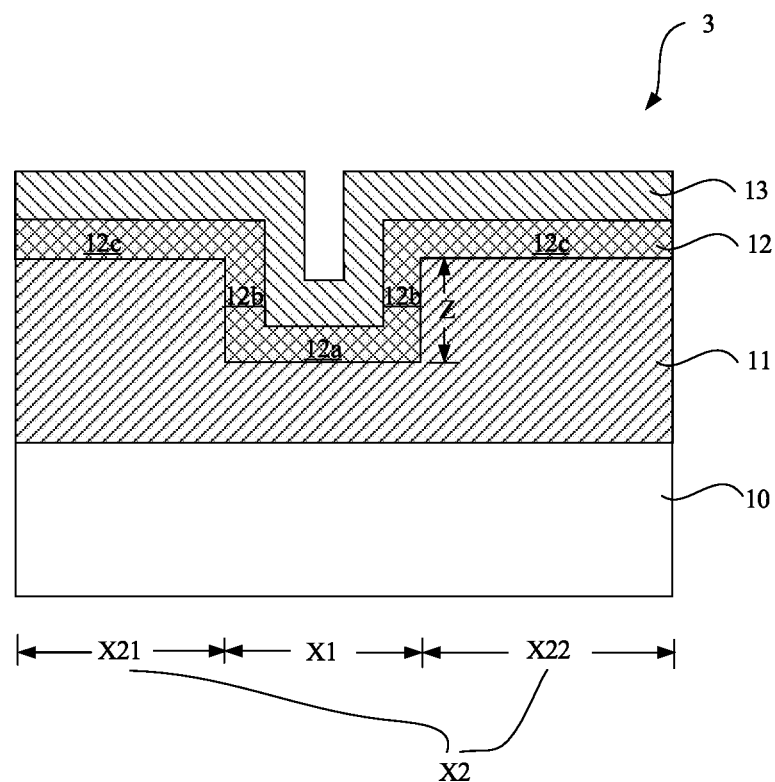
FIG. 14 is a schematic sectional view illustrating a full-color LED structure unit according to a third embodiment of the present disclosure.

FIG. 14 is a schematic sectional view illustrating a full-color LED structure unit according to a third embodiment of the present disclosure. Referring to FIG. 14, a full-color LED structure unit 3 and a method for manufacturing the same in the third embodiment are substantially the same as the full-color LED structure units 1 and 2 and the methods in the first and second embodiments. The first semiconductor layer 11 is formed on the substrate 10, and the substrate 10 has a flat surface.

The material of the substrate 10 may be sapphire, silicon carbide, silicon, silicon on insulator (SOI), lithium niobate, GaN, AlN, or diamond.

The growth process of the first semiconductor layer 11 may be referred to the growth process of the second semiconductor layer 13.

Figure 15:
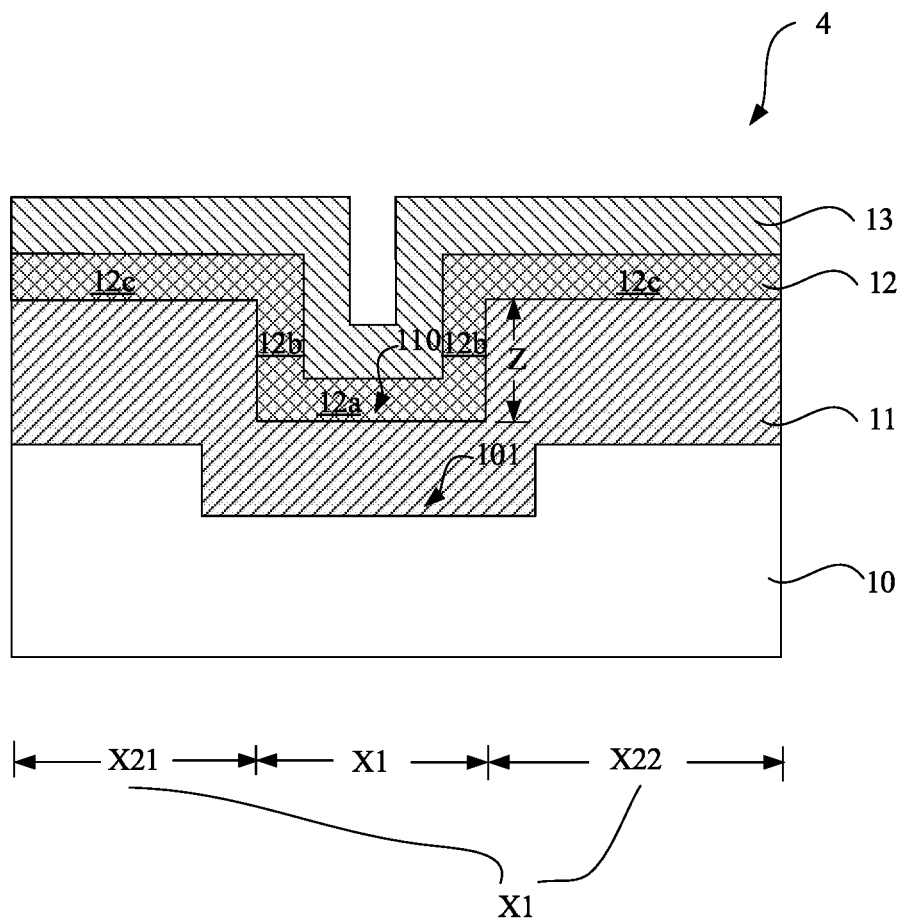
FIG. 15 is a schematic sectional view illustrating a full-color LED structure unit according to a fourth embodiment of the present disclosure.

FIG. 15 is a schematic sectional view illustrating a full-color LED structure unit according to a fourth embodiment of the present disclosure. Referring to FIG. 15, a full-color LED structure unit 4 and a method for manufacturing the same in the fourth embodiment are substantially the same as the full-color LED structure unit 3 and the method in the third embodiment, with the difference only being that a second trench 101 is formed in the substrate 10, and the first trench 110 is formed at the second trench 101 correspondingly.

The second trench 101 may be formed by dry etching or wet etching, and when the first semiconductor layer 11 is epitaxially grown in the second trench 101 and on the top surface of the substrate 10, and in the first semiconductor layer 11, a first trench 110 can be formed at the second trench 101.

Figure 16:
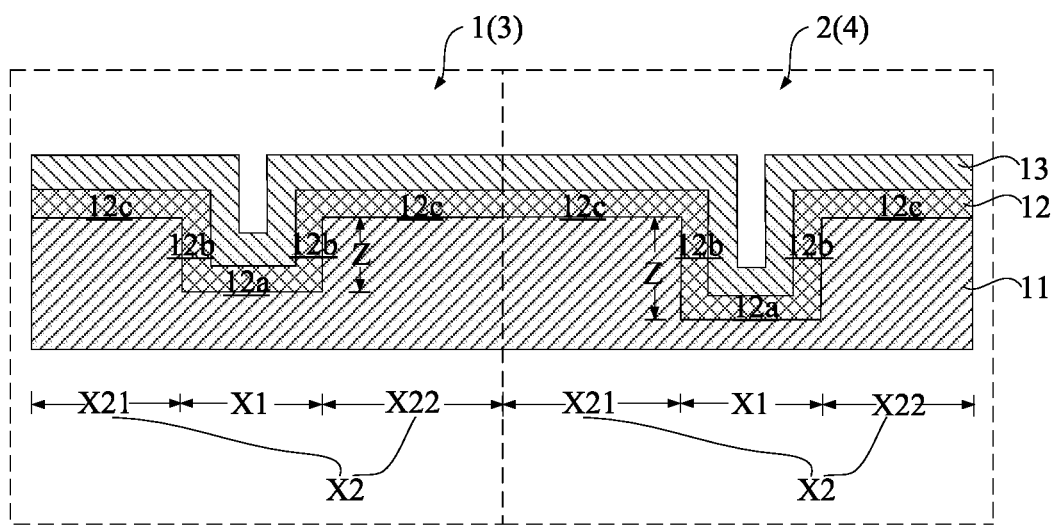
FIG. 16 is a schematic sectional view illustrating a full-color LED structure according to a fifth embodiment of the present disclosure.

FIG. 16 is a schematic sectional view illustrating a full-color LED structure according to a fifth embodiment of the present disclosure. Referring to FIG. 16, the full-color LED structure includes a plurality of full-color LED structure units 1, 2, 3, and 4 of any of the above embodiments.

In an embodiment, at least one of the plurality of full-color LED structure units 1, 2, 3, 4 has a different surface dimension of the bottom wall 110*a* from the other full-color LED structure units, and/or at least one of the plurality of the full-color LED structure units has a different surface dimension of the side wall 110*b* from the other full-color LED structure units, and/or at least one of the plurality of the full-color LED structure units has a different surface dimension of the top wall 11*c* from the other full-color LED structure units. For example, in FIG. 16, the height of the side walls 110*b* of the full-color LED structure unit 1 differs from that of the full-color LED structure unit 2.

In an embodiment, the plurality of full-color LED structure units 1, 2, 3 and 4 are divided into a plurality of groups, in other words, the plurality of full-color LED structure units 1, 2, 3 and 4 are repeated structures in groups. In each of the plurality of groups, at least one full-color LED structure unit has a different surface dimension of the bottom wall 110*a*, the side wall 110*b* or the top wall 11*c* from the other full-color LED structure units of the group.

In an embodiment, a plurality of full-color LED structure units 1, 2, 3 and 4 are divided into a plurality of groups, the full-color LED structure units of each of the plurality of groups are the same; the full-color LED structure units of at least one of the plurality of groups have a different surface dimension of the bottom wall 110*a*, the side wall 110*b* or the top wall 11*c* from the full-color LED structure units of the other groups.

In an embodiment, the first semiconductor layers 11 of the full-color LED structure units 1, 2, 3 and 4 are connected together, or the second semiconductor layers 13 of the full-color LED structure units 1, 2, 3 and 4 are connected together to facilitate applying a voltage to each of the full-color LED structure units 1, 2, 3 and 4.

Compared to the related art, the present disclosure has the following beneficial effect.

Due to the different surface dimension of the bottom wall, the side wall, or the top wall of the first trench in the first semiconductor layer, the growth speed of the corresponding light-emitting layer on each surface is different, and the doping efficiency of the light-emitting wavelength sensitive elements in the grown light-emitting layer is different, resulting in different component ratios of the light-emitting wavelength sensitive elements in the grown light-emitting layer, and different light-emitting wavelengths of the LED. The above process is simple and can form full-color LED structure units during a single epitaxial growth process of the light-emitting layer, such that the size of the full-color LED is reduced, the cost is reduced, the service life is extended, and the reliability is improved.

Although the present disclosure is disclosed as above, the present disclosure is not limited thereto. Any person skilled in the art may make various changes and modifications without departing from the spirit and scope of the present disclosure, and therefore the scope of the present disclosure should be subject to the scope defined by the claims.

The invention claimed is:
1. A full-color LED structure unit, comprising:
a first semiconductor layer, in which a first trench is provided;
a light-emitting layer comprising a first sub-region, a second sub-region and a third sub-region, wherein the first sub-region covers a bottom wall of the first trench, the second sub-region covers side walls of the first trench, and the third sub-region covers a top wall of the first semiconductor layer; and a second semiconductor layer covering the light-emitting layer, wherein the second semiconductor layer has an opposite conductive type to the first semiconductor layer, and materials of the first semiconductor layer, the light-emitting layer, and the second semiconductor layer are a group III-V compound;
wherein different wavelengths of light emitted from the first sub-region, the second sub-region and the third sub-region are achieved by controlling different surface dimensions of the bottom wall and the side wall of the first trench or the top wall of the first semiconductor layer.

2. The full-color LED structure unit of claim 1, wherein in any one vertical section of the full-color LED structure unit, a width of the bottom wall is smaller than a width of the top wall, and a wavelength of light emitted from the third sub-region is greater than a wavelength of light emitted from any one of the first sub-region and the second sub-region.

3. The full-color LED structure unit of claim 1, wherein the side walls comprise a first side wall which is perpendicular to a first vertical section of the full-color LED structure unit; in the first vertical section, the bottom wall has a width greater than a height of the side wall, and a wavelength of light emitted from the first sub-region is greater than a wavelength of light emitted from the second sub-region on the first side wall; or the bottom wall has a width smaller than a height of the side wall, and a wavelength of light emitted from the first sub-region is smaller than a wavelength of light emitted from the second sub-region on the first side wall; and/or
the side walls comprise a second side wall which is perpendicular to a second vertical section of the full-color LED structure unit; in the second vertical section, the bottom wall has a length greater than a height of the side wall, and a wavelength of light emitted from the first sub-region is greater than a wavelength of light emitted from the second sub-region on the second side wall; or the bottom wall has a length smaller than a height of the side wall, and a wavelength of light emitted from the first sub-region is smaller than a wavelength of light emitted from the second sub-region on the second side wall.

4. The full-color LED structure unit of claim 1, wherein the first semiconductor layer is disposed on a substrate, the substrate has a flat surface, or the substrate is provided with a second trench, and the first trench is disposed correspondingly at the second trench.

5. The full-color LED structure unit of claim 1, wherein the light-emitting layer comprises a single quantum well layer or a multiple quantum well layer, the single quantum well layer or the multiple quantum well layer comprises an indium element.

6. The full-color LED structure unit of claim 5, wherein in any one vertical section of the full-color LED structure unit, a width of the bottom wall is smaller than a width of the top wall, in a case that a material of the third sub-region and a material of the first sub-region are both InGaN, a percentage of an In element in the third sub-region is higher than that in the first sub-region.

7. The full-color LED structure unit of claim 6, wherein in a case that the material of the third sub-region and a material of the second sub-region are both InGaN, the percentage of the In element in the third sub-region is higher than that in the second sub-region.

8. The full-color LED structure unit of claim 5, wherein a length of the bottom wall is greater than a height of the side wall, in a case that a material of the first sub-region and a material of the second sub-region are both InGaN, a percentage of an In element in the first sub-region is higher than that in the second sub-region.

9. A full-color LED structure, comprising: a plurality of full-color LED structure units according to claim 1.

10. The full-color LED structure of claim 9, wherein at least one of the plurality of full-color LED structure units has a different surface dimension of the bottom wall from the other full-color LED structure units, and/or at least one of the plurality of the full-color LED structure units has a different surface dimension of the side wall from the other full-color LED structure units, and/or at least one of the plurality of the full-color LED structure units has a different surface dimension of the top wall from the other full-color LED structure units.

11. The full-color LED structure of claim 9, wherein the plurality of full-color LED structure units are divided into a plurality of groups, and in each of the plurality of groups, at least one full-color LED structure unit has a different surface dimension of the bottom wall, the side wall or the top wall from the other full-color LED structure units of the group.

12. The full-color LED structure of claim 9, wherein the plurality of full-color LED structure units are divided into a plurality of groups, for each of the plurality of groups, the full-color LED structure units of the group are the same; the full-color LED structure units of at least one of the plurality of groups have a different surface dimension of the bottom wall, the side wall or the top wall from the full-color LED structure units of the other groups of the plurality of groups.

13. The full-color LED structure of claim 9, wherein the first semiconductor layers of the plurality of full-color LED structure units are connected together, or the second semiconductor layers of the plurality of full-color LED structure units are connected together.

14. The full-color LED structure unit of claim 1, wherein a cross section of the first trench has a rectangular shape.

15. A method for manufacturing a full-color LED structure unit, comprising:
providing a first semiconductor layer, in which a first trench is formed;
forming a light-emitting layer comprising a first sub-region, a second sub-region and a third sub-region, wherein the first sub-region covers a bottom wall of the first trench, the second sub-region covers side walls of the first trench, and the third sub-region covers a top wall of the first semiconductor layer; and
forming a second semiconductor layer covering the light-emitting layer, wherein the second semiconductor layer has an opposite conductive type to the first semiconductor layer, and materials of the first semiconductor layer, the light-emitting layer, and the second semiconductor layer are a group III-V compound;
wherein different wavelengths of light emitted from the first sub-region, the second sub-region and the third sub-region are achieved by controlling different surface dimensions of the bottom wall and the side wall of the first trench or the top wall of the first semiconductor layer.

16. The method of claim 15, wherein in any one vertical section of the full-color LED structure unit, a width of the bottom wall is controlled to be smaller than a width of the top wall, such that a wavelength of light emitted from the third sub-region is greater than a wavelength of light emitted from any one of the first sub-region and the second sub-region.

17. The method of claim 15, wherein
the side walls comprise a first side wall which is perpendicular to a first vertical section of the full-color LED structure unit; in the first vertical section, a width of the bottom wall is controlled to be greater than a height of the side wall, such that a wavelength of light emitted from the first sub-region is greater than a wavelength of light emitted from the second sub-region on the first side wall; or a width of the bottom wall is controlled to be smaller than a height of the side wall, such that a wavelength of light emitted from the first sub-region is smaller than a wavelength of light emitted from the second sub-region on the first side wall; and/or
the side walls comprise a second side wall which is perpendicular to a second vertical section of the full-color LED structure unit; in the second vertical section, a length of the bottom wall is controlled to be greater than a height of the side wall, such that a wavelength of light emitted from the first sub-region is greater than a wavelength of light emitted from the second sub-region on the second side wall; or a length of the bottom wall is controlled to be smaller than a height of the side wall, such that a wavelength of light emitted from the first sub-region is smaller than a wavelength of light emitted from the second sub-region on the second side wall.

18. The method of claim 15, wherein the first semiconductor layer is formed on a substrate, the substrate has a flat surface, or a second trench is formed in the substrate, and the first trench is formed correspondingly at the second trench.

19. The method of claim 15, wherein the light-emitting layer comprises a single quantum well layer or a multiple quantum well layer, the single quantum well layer or the multiple quantum well layer comprises an indium element.

* * * * *